United States Patent [19]

Kitabayashi et al.

[11] Patent Number: 5,530,616

[45] Date of Patent: Jun. 25, 1996

[54] ELECTROSTASTIC CHUCK

[75] Inventors: Tetsuo Kitabayashi; Atsushi Obara; Jun Miyagi, all of Fukuoka; Yasumi Sago; Masami Sasaki, both of Tokyo, all of Japan

[73] Assignees: Toto Ltd., Fukuoka; Anelva Co., Tokyo, both of Japan

[21] Appl. No.: 341,001

[22] Filed: Nov. 17, 1994

[30] Foreign Application Priority Data

Nov. 29, 1993 [JP] Japan ................................. 5-298388

[51] Int. Cl.$^6$ ................................................. H02N 13/00
[52] U.S. Cl. ................................................................ 361/234
[58] Field of Search ........................ 361/234; 279/128; 269/8; 29/825, 829

[56] References Cited

U.S. PATENT DOCUMENTS

| | | | |
|---|---|---|---|
| 4,502,094 | 2/1985 | Lewin et al. | 361/234 |
| 4,565,601 | 1/1986 | Kakehi et al. | 156/643 |
| 4,724,510 | 2/1988 | Wicker et al. | |
| 4,962,441 | 10/1990 | Collins. | |
| 5,104,834 | 4/1992 | Watanabe et al. | |
| 5,160,152 | 11/1992 | Toraguchi et al. | |
| 5,191,506 | 3/1993 | Logan et al. | |
| 5,213,349 | 5/1993 | Elliott. | |
| 5,267,607 | 12/1993 | Wada | 165/80.1 |
| 5,306,895 | 4/1994 | Ushikoshi et al. | 219/385 |
| 5,315,473 | 5/1994 | Collins et al. | |
| 5,350,479 | 9/1994 | Collins et al. | 156/345 |

FOREIGN PATENT DOCUMENTS

| | | |
|---|---|---|
| 1-313954 | 12/1989 | Japan. |
| 5-6933 | 12/1989 | Japan. |
| 3-73453 | 7/1991 | Japan. |
| 5275513 | 10/1993 | Japan. |
| 6177231 | 6/1994 | Japan. |

OTHER PUBLICATIONS

J. Electrochem. Soc., vol. 140, No. 11, Nov. 1993, pp. 3245–3255; by Daviet et al.; "Electrostatic Clamping Applied to Semiconductor Plasma Processing".

Jpn. J. Appl. Phys., vol. 32 (1993) pp. 864–871; Part 1, No. 2, Feb. 1993 by Watanabe et al.; "Relationship between Electrical Resistivity and Electrostatic Force of Alumina Electrostatic Chuck".

Jpn. J. Appln. Phys., vol. 31 (1992) pp. 2145–2150; Part 1, No. 7, Jul. 1992 by Watanabe et al.; "Electrostatic Force and Absorption Current of Alumina Electrostatic Chuck".

*Primary Examiner*—Fritz Fleming
*Attorney, Agent, or Firm*—Weiner, Carrier & Burt; Joseph P. Carrier; Irving M. Weiner

[57] ABSTRACT

An electrostatic chuck for electrostatically clamping a semiconductor wafer while minimizing any plane temperature difference thereof has a dielectric layer joined to a metal plate and an inner electrode disposed in the di-electric layer. The dielectric layer has a raised outer rim disposed on an upper surface thereof along an outer peripheral edge thereof, and a plurality of protrusions disposed on the upper surface radially inwardly of the outer rim, the protrusions having upper surfaces for clamping the semiconductor wafer in direct contact therewith. The volume resistivity of the dielectric layer is $10^9$ $\Omega$m or less, and Rmax (maximum height) of the clamping surfaces of the protrusions 5 is 2.0 μm or less and or Ra (center-line average roughness) thereof is 0.25 μm or less. The ratio of the total area of the clamping surfaces of the protrusions to the entire area of the upper surface of the dielectric layer is equal to or greater than 1% and less than 10%.

19 Claims, 3 Drawing Sheets

ELECTROSTATIC CHUCK

BACKGROUND OF THE INVENTION

1. Field of the Invention

The present invention relates to an electrostatic chuck for fixing a workpiece such as a semiconductor wafer or the like under electrostatic forces.

2. Description of the Relevant Art

For etching or otherwise processing a semiconductor wafer in a plasma atmosphere, it is necessary to keep the semiconductor wafer under a reduced pressure, i.e., in an atmosphere which tends to produce a plasma easily.

Known electrostatic chucks for fixing a semiconductor wafer under low pressure are disclosed in Japanese laid-open patent publications Nos. 1-313954 and 5-6933 and Japanese laid-open utility model publication No. 3-73453.

The disclosed electrostatic chucks have an inner electrode disposed in a dielectric layer having an upper attracting or clamping surface for attracting or clamping a semiconductor wafer under electrostatic forces that are generated when a voltage is applied to the inner electrode. As used throughout the present disclosure, the term "clamp" indicates the electrostatic force applied by the electrostatic chuck to a workpiece supported on the chuck for maintaining the workpiece at a given position relative to the chuck. According to Japanese laid-open patent publication No. 1-313954, the upper surface of the dielectric layer has projections for applying stronger electrostatic forces to a semiconductor wafer at its central area and weaker electrostatic forces to the semiconductor wafer at its peripheral area. According to Japanese laid-open utility model publication No. 3-73453, grooves are defined in the upper surface of the dielectric layer, and a coolant gas such as a helium gas is supplied to the grooves for making uniform the temperature of the entire surface of a semiconductor wafer that is clamped to the dielectric layer. The upper surface of the dielectric layer of the electrostatic chuck disclosed in Japanese laid-open patent publication No. 5-6933 has recesses and teeth (contact regions) for supporting a semiconductor wafer on the upper surfaces of the teeth to prevent dust particles from being adhered to the semiconductor wafer.

When a semiconductor wafer is etched or otherwise processed in a plasma atmosphere, the surface of the semiconductor wafer is heated to a high temperature due to the heat of the plasma. As the temperature of the surface of the semiconductor wafer increases, the resist film on the surface of the semiconductor wafer tends to burst or have pop holes generated therein. Another problem is that if there is developed a plane temperature difference, then the semiconductor wafer will not be processed uniformly.

The use of a coolant gas such as a helium gas, as disclosed in Japanese laid-open utility model publication No. 3-73453, is effective to make uniform the temperature of the entire surface of a semiconductor wafer clamped to the electrostatic chuck. For greater cooling efficiency, the semiconductor wafer should have a greater surface area held in contact with the coolant gas. To increase the surface area of the semiconductor wafer that is held in contact with the coolant gas, it is necessary to minimize the total area of the upper surfaces of ridges between the grooves with respect to the entire area of the upper surface of the dielectric layer. However, if the total area of the upper surfaces of ridges which clamp the semiconductor wafer in contact therewith is reduced, then the clamping forces will also be reduced, possibly allowing the semiconductor wafer to be slipped off fixed position or disengaged from the electrostatic chuck while the semiconductor wafer is being processed.

The ratio of the total area of the surface regions held in contact with the semiconductor wafer to the entire area of the upper surface of the dielectric layer has been in the range of from 10 to 30% at maximum, as disclosed in Japanese laid-open patent publication No. 5-6933. As a result, it has not been possible to substantially increase the surface area of the semiconductor wafer which is held in contact with the coolant gas. With the conventional electrostatic chucks, therefore, the semiconductor wafer cannot be cooled sufficiently, and the plane temperature of the semiconductor wafer is liable to develop undesirable differences therein.

Higher cooling efficiency may be achieved by increasing the pressure of the coolant gas held in contact with the semiconductor wafer. Simply increasing the pressure of the coolant gas, however, often causes the semiconductor wafer to crack or be slipped of fixed position.

SUMMARY OF THE INVENTION

It is an object of the present invention to provide an electrostatic chuck capable of electrostatically clamping a workpiece under large clamping forces which can quickly be saturated upon application of a voltage and quickly be removed to release the workpiece upon interruption of the voltage.

According to the present invention, an electrostatic chuck for clamping a workpiece under electrostatic forces has a dielectric layer and an inner electrode disposed in the dielectric layer for producing electrostatic forces in response to application of a voltage thereto, the dielectric layer having a volume resistivity of at most $10^9$ Ωm, the dielectric layer including a plurality of protrusions disposed on an upper surface thereof for clamping a workpiece thereto, the protrusions having clamping surfaces, respectively, for clamping the workpiece in contact therewith, the clamping surfaces having a total area proportioned to the area of the upper surface of the dielectric layer at a ratio of at least 1% and less than 10%. The clamping surfaces may have a maximum height Rmax of at most 2.0 μm or a center-line average roughness of at most 0.25 μm. Each of the protrusions may have a diameter of at most 3 mm, and adjacent ones of the protrusions may be spaced at most 11 mm from each other. The dielectric layer may have a coolant gas inlet hole defined therein and having an end opening at the upper surface thereof, for introducing a coolant gas into a space between the upper surface of the dielectric layer and the workpiece under a pressure ranging from 10 torr to 100 torr when the workpiece is clamped to the clamping surfaces.

The above and further objects, details and advantages of the present invention will become apparent from the following detailed description of a preferred embodiment thereof, when read in conjunction with the accompanying drawings.

DETAILED DESCRIPTION OF THE PREFERRED EMBODIMENT

Figure 1:
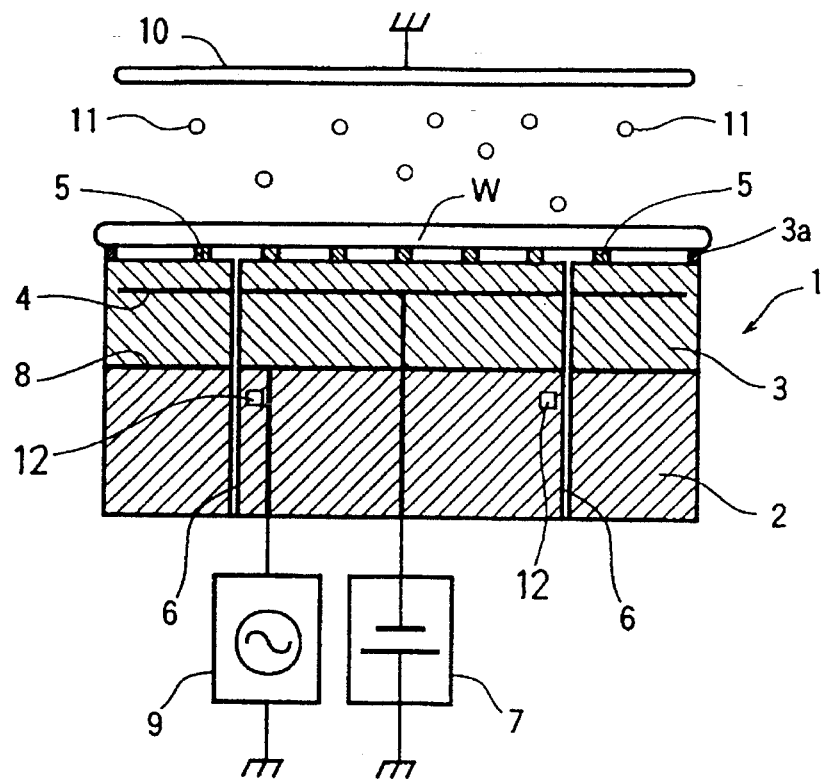
FIG. 1 is a cross-sectional view of an electrostatic chuck according to the present invention.

As shown in FIG. 1, an electrostatic chuck 1 according to the present invention comprises a metal plate 2, a dielectric layer 3 joined to an upper surface of the metal plate 2, and an inner electrode 4 embedded or sandwiched in the dielectric layer 3. A conductive layer 8 is disposed on a lower surface of the dielectric layer 3.

Figure 2:
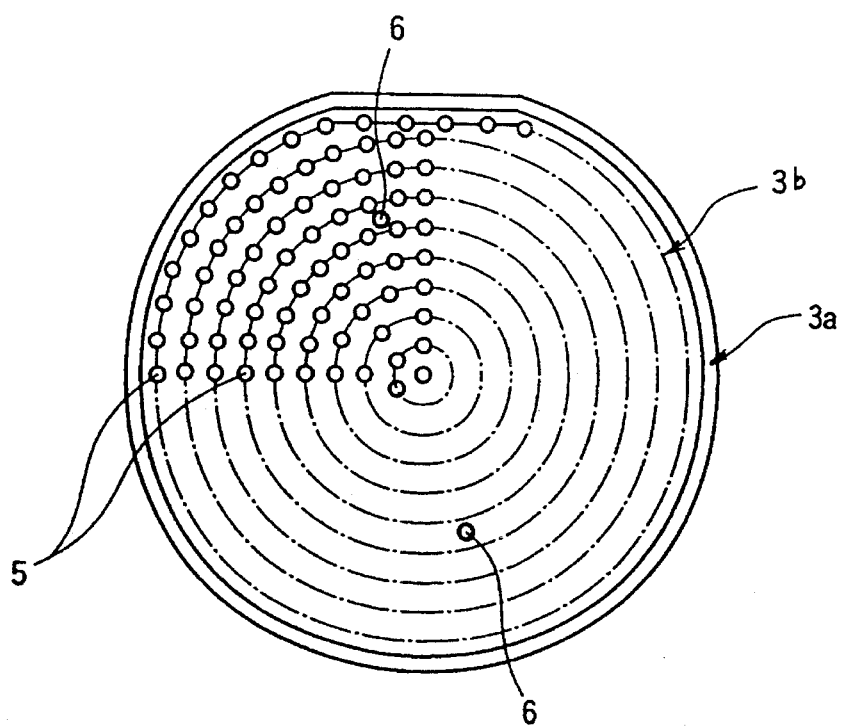
FIG. 2 is a plan view of the electrostatic chuck shown in FIG. 1.

An outer region or rim 3a is disposed on and raised from an upper surface of the dielectric layer 3 along its outer peripheral edge for preventing a helium gas from leaking out, the outer rim 3a having a width ranging from 1 to 5 mm. The upper surface of the dielectric layer 3 has a plurality of protrusions 5 positioned within a clamping region 3b surrounded by, i.e., disposed radially inwardly of, the outer rim 3a and raised upwardly to substantially the same height as the outer rim 3a. The protrusions 5 have upper portions or surfaces serving as clamping surfaces for being held in direct contact with a semiconductor wafer W. As shown in FIG. 2, the protrusions 5 are arranged in a multiplicity of concentric circular patterns disposed in the clamping region 3b around the center of the upper surface of the dielectric layer 3, with the outer rim 3a being positioned radially outwardly of the concentric circular patterns of the protrusions 5. The protrusions 5 may however be arranged in other patterns.

The electrostatic chuck 1 also has a pair of diametrically opposite coolant gas inlet holes 6 defined through the metal plate 2 and the dielectric layer 3 and having upper ends open at the upper surface of the dielectric layer 3. A coolant gas such as a helium gas is supplied through the coolant gas inlet holes 6 into a gap or space that is defined between the upper surface of the dielectric layer 3 and the lower surface of the semiconductor wafer W which is placed on the outer rim 3a and the protrusions 5. The metal plate 2 has a pair of flow passages 12 defined therein for passage of a coolant for cooling the electrostatic chuck 1.

A DC power supply circuit 7 is electrically connected to the inner electrode 4, and a high-frequency power source 9 is electrically connected to the conductive layer 8 on the lower surface of the dielectric layer 3. Alternatively, the DC power source 7 may be electrically connected to the metal plate 2, and the high-frequency power source 9 may be electrically connected to the inner electrode 4. The electrostatic chuck 1 is placed in a plasma processing apparatus which has a grounded opposite electrode 10 positioned above the electrostatic chuck 1.

In operation, the semiconductor wafer W is placed on the electrostatic chuck 1, and a DC voltage is applied to the inner electrode 4 by the DC power supply circuit 7 for electrostatically clamping the semiconductor wafer W to the dielectric layer 3, specifically, the upper clamping surfaces of the protrusions 5. When a high-frequency voltage is applied to the conductive layer 8 by the high-frequency power source 9, active radicals 11 are produced between the semiconductor wafer W and the opposite electrode 10, etching an Si oxide film or the like on the semiconductor wafer W.

According to the present invention, the ratio of the total area of the clamping surfaces of the protrusions 5 to the entire area of the clamping region 3b of the dielectric layer 3 is equal to or greater than 1% and less than 10%. The area ratio should be at least 1% in order to produce necessary clamping forces. The reasons why the area ratio should be less than 10% will be described below with reference to FIGS. 3(a), 3(b) and 4(a), 4(b).

Figure 3:
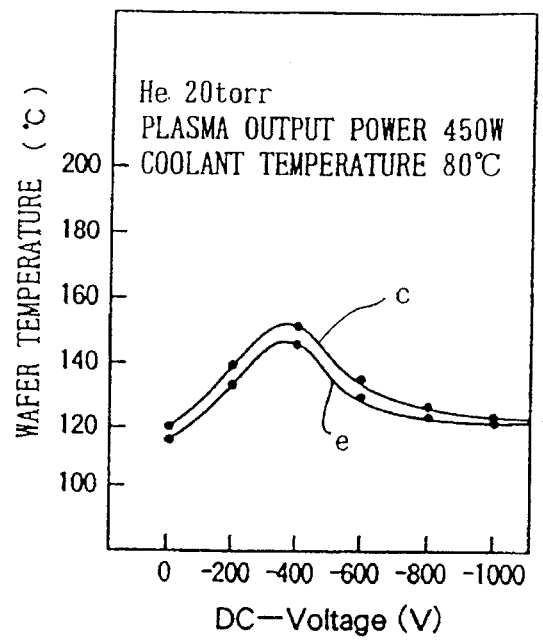
FIG. 3(a) is a graph showing the relationship between the DC voltage applied to a semiconductor wafer and the temperature of the semiconductor wafer at central and edge regions (c), (e) thereof when the semiconductor wafer is processed under a plasma output power of 450 W while the semiconductor wafer is being clamped to the electrostatic chuck shown in FIGS. 1 and 2 with the ratio of the total area of the upper surfaces of protrusions to the entire area of the upper surface of a dielectric layer of the electrostatic chuck being less than 10%.
FIG. 3(b) is a graph showing the relationship between the DC voltage applied to a semiconductor wafer and the temperature of the semiconductor wafer at central and edge regions (c), (e) thereof when the semiconductor wafer is processed under a plasma output power of 550 W while the semiconductor wafer is being clamped to the electrostatic chuck shown in FIGS. 1 and 2 with the ratio of the total area of the upper surfaces of protrusions to the entire area of the upper surface of a dielectric layer of the electrostatic chuck being less than 10%.
Figure 3:
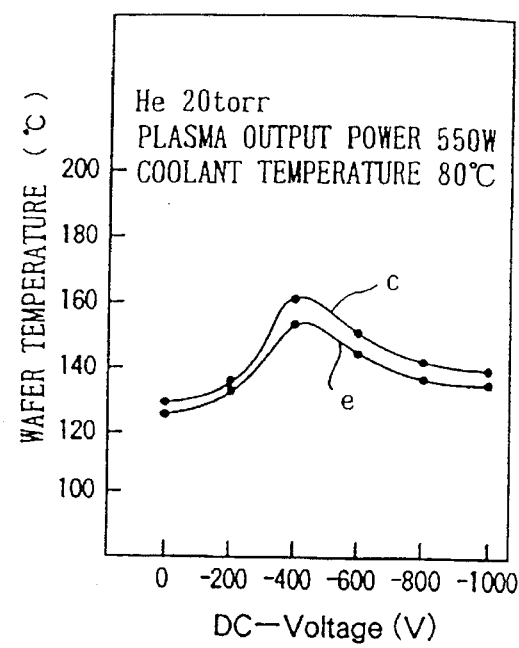
Figure 4:
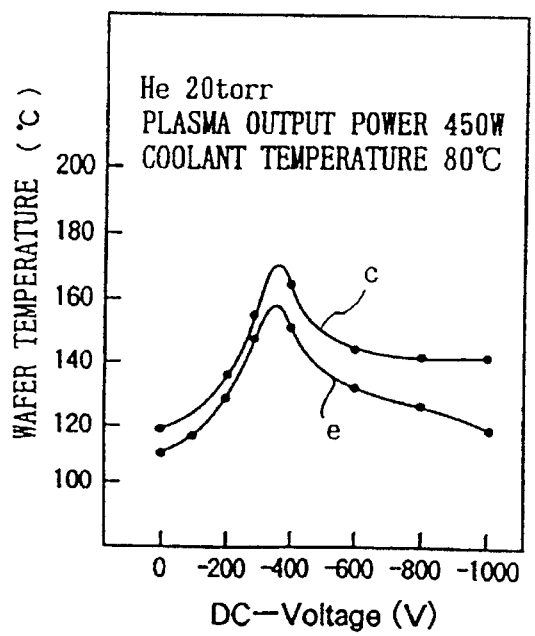
FIG. 4(a) is a graph showing the relationship between the DC voltage applied to a semiconductor wafer and the temperature of the semiconductor wafer at central and edge regions (c), (e) thereof when the semiconductor wafer is processed under given plasma processing conditions plasma output power of 450 W while the semiconductor wafer is being clamped to the electrostatic chuck shown in FIGS. 1 and 2 with the ratio of the total area of the upper surfaces of protrusions to the entire area of the upper surface of a dielectric layer of the electrostatic chuck being 75%.
FIG. 4(b) is a graph showing the relationship between the DC voltage applied to a semiconductor wafer and the temperature of the semiconductor wafer at central and edge regions (c), (e) thereof when the semiconductor wafer is processed under a plasma output power of 550 W while the semiconductor wafer is being clamped to the electrostatic chuck shown in FIGS. 1 and 2 with the ratio of the total area of the upper surfaces of protrusions to the entire area of the upper surface of a dielectric layer of the electrostatic chuck being 75%.
Figure 4:
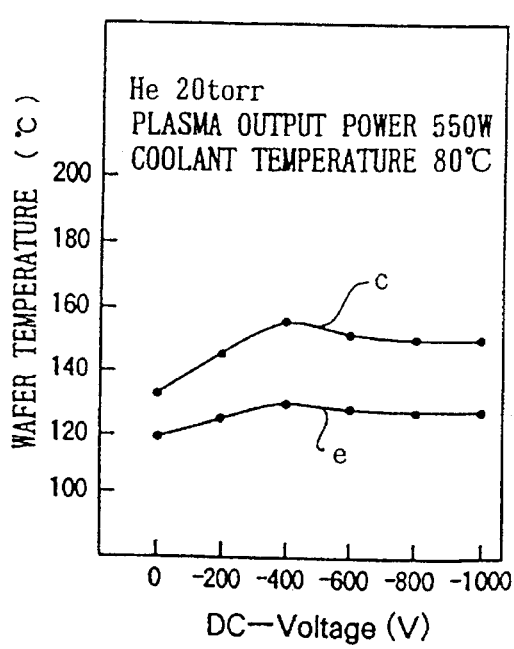

FIGS. 3(a) and 3(b) are graphs showing the relationship between the applied DC voltage and the wafer temperature when the semiconductor wafer W is processed under different plasma output power while the area ratio is less than 10%, and FIGS. 4(a) and 4(b) are graphs showing the relationship between the applied DC voltage and the wafer temperature when the semiconductor wafer W is processed under varying plasma processing conditions while the area ratio is 75%.

It can be seen from FIGS. 3(a) and 3(b) that when the area ratio is less than 10% the temperature of a central region of the semiconductor wafer W (indicated by a curve "c") and temperature of an edge region of the semiconductor wafer W (indicated by a curve "e") are substantially equal to each other. It can be seen from FIGS. 4(a) and 4(b) that when the area ratio is 75%, the temperatures of the central and edge regions of the semiconductor wafer W differ widely from each other, and hence the semiconductor wafer W suffers irregular plane temperatures.

When the area ratio is less than 10%, the surface area of the semiconductor wafer W which is brought into direct contact with the coolant gas is relatively large, resulting in high cooling efficiency.

Table 1, given below, shows the relationship between the pressure of the coolant gas and the area ratio. A study of Table 1 indicates that the cooling efficiency is increased when the area ratio is less than 10%.

TABLE 1

| He gas pressure/torr | 10 | 20 | 30 | 50 |
|---|---|---|---|---|
| Area ratio: less than 10% | 135° C. | 120° C. | 110° C. | 100° C. |
| Area ratio: 75% | 145° C. | 140° C. | 135° C. | 130° C. |

Plasma output power: 450 W
Coolant temperature: 80° C.
Gas containing Cl atoms: 0.15 Torr Table 2, given below, shows the relationship between the spacing between the protrusions (or the diameter of the protrusions) and the coolant gas pressure, as represented by successful clamping of the semiconductor wafer and damage or displacement of the semiconductor wafer, when the area ratio is less than 10%.

It can be understood from Table 2 that when the spacing between the protrusions 5 is reduced, or the diameter of the protrusions 5 is reduced, the coolant gas can be introduced at a higher pressure. With the illustrated electrostatic chuck 1, it is preferable for each of the protrusions 5 to have a diameter of 3 mm or less, and for adjacent ones of the protrusions 5 to be spaced 11 mm or less from each other.

TABLE 2

|  | Spacing between protrusions (mm) | | | | | |
|---|---|---|---|---|---|---|
|  | 4 | 6 | 9 | 11 | 14 | 17 |
| He gas pressure (torr) | | | | | | |
| 10 | O | O | O | O | O | O |
| 20 | O | O | O | O | O | O |
| 30 | O | O | O | O | X | X |
| 50 | O | O | O | X | X | X |
| 100 | O | O | O | X | X | X |

O: The semiconductor wafer successfully clamped
X: The semiconductor wafer damaged or displaced.

Figure 5:
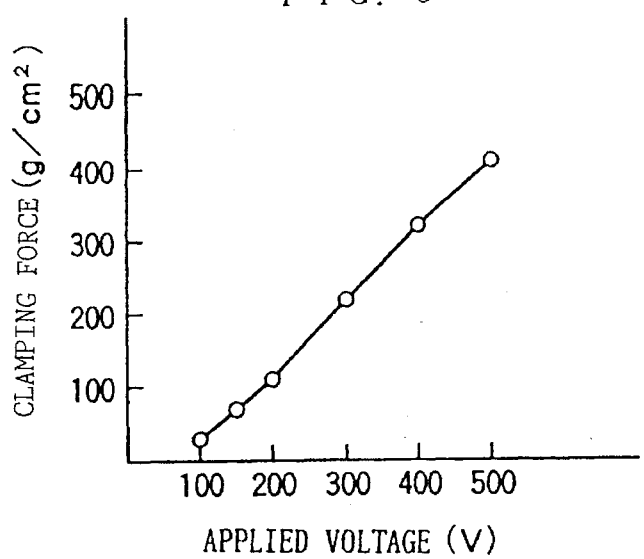
FIG. 5 is a graph showing the relationship between the voltage applied to a semiconductor wafer and the clamping force acting on the semiconductor wafer while the semiconductor wafer is being clamped to the electrostatic chuck shown in FIGS. 1 and 2 with the ratio of the total area of the upper surfaces of protrusions to the entire area of the upper surface of a dielectric layer of the electrostatic chuck being less than 10%.

FIG. 5 is a graph showing the relationship between the clamping force acting on at room temperature and the voltage applied to the semiconductor wafer W by the electrostatic chuck 1 according to the present invention. It can be seen from FIG. 5 that the electrostatic chuck 1 is capable of exerting sufficient clamping forces even though the area ratio is less than 10%. The reasons for this will be described below with reference to FIG. 6 and the equation (1) given below.

Figure 6:
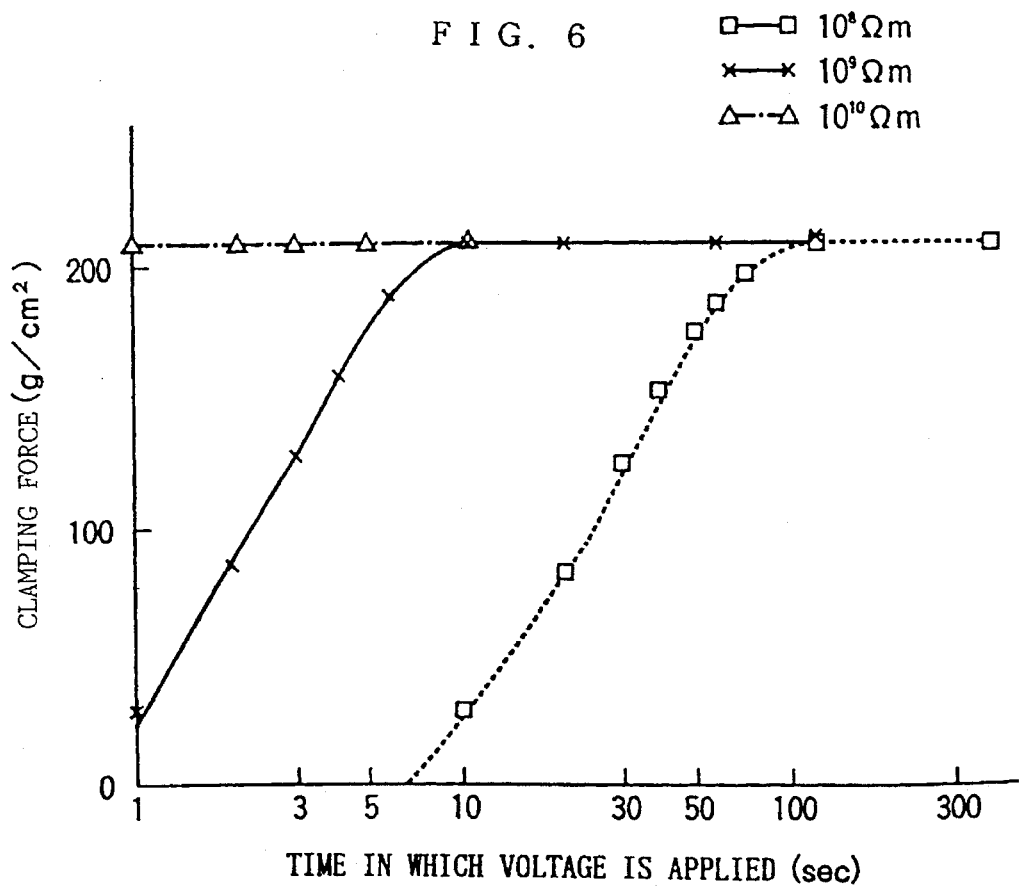
FIG. 6 is a graph showing the relationship between the volume resistivity of a dielectric layer, the time in which the voltage is applied to a semiconductor wafer, and the clamping force acting on the semiconductor wafer while the semiconductor wafer is being clamped to the electrostatic chuck shown in FIGS. 1 and 2 with the ratio of the total area of the upper surfaces of protrusions to the entire area of the upper surface of the dielectric layer of the electrostatic chuck being less than 10%.

FIG. 6 is a graph showing the relationship between the volume resistivity of the dielectric layer 3 at room temperature, the time in which the voltage is applied to the semiconductor wafer W, and the clamping force acting on the semiconductor wafer W at room temperature. It can be understood from FIG. 6 that the clamping force is quickly saturated upon application of the voltage if the volume resistivity of the dielectric layer 3 is $10^9$ Ωm or less.

The equation (1), given below, represents the relationship between the clamping force F and the maximum height (Rmax) of the clamping surfaces.

$$F = \epsilon_0 \cdot V^2 / 2\delta^2, \tag{1}$$

where F: the clamping force;
$\epsilon_0$: the dielectric constant of vacuum;
V: the potential difference between the electrostatic chuck and the semiconductor wafer; and
$\delta$: the average value of surface roughness (maximum roughness Rmax) of the electrostatic chuck and the semiconductor wafer.

It can be seen from the equation (1) that the clamping force F can be maintained at a sufficient level if Rmax (maximum height) of the clamping surfaces is 2.0 μm or less or Ra (center-line average roughness) thereof is 0.25 μm or less.

Therefore, in order to keep the area ratio less than 10% it is necessary that, when the electrostatic chuck 1 according to the present invention is used at room temperature, the volume resistivity of the dielectric layer 3 be $10^9$ Ωm or less, Rmax (maximum height) of the clamping surfaces be 2.0 μm or less or Ra (center-line average roughness) be 0.25 μm or less.

As described above, the volume resistivity of the dielectric layer 3 in which the inner electrode 4 is embedded or sandwiched is $10^9$ Ωm or less, Rmax (maximum height) of the clamping surfaces of the protrusions 5 on the dielectric layer 3 is 2.0 μm or less or Ra (center-line average roughness) thereof is 0.25 μm or less, and the ratio of the total area of the clamping surfaces of the protrusions 5 to the entire area of the clamping region 3b of the dielectric layer 3 is equal to or greater than 1% and less than 10%. Therefore, the electrostatic chuck 1 can produce large clamping forces which can quickly be saturated upon application of the voltage and quickly be removed to release the semiconductor wafer W upon interruption of the voltage.

The ratio of the total area of the electrostatic chuck 1 which is held in contact with the semiconductor wafer W to the entire area of the clamping region 3b of the dielectric layer 3 is less than 10%. As a result, it is possible to process the semiconductor wafer W clamped to the electrostatic chuck 1 while a coolant gas is being introduced into the gap between the upper surface of the dielectric layer 3 and the semiconductor wafer W under a pressure ranging from 10 torr to 100 torr. Since the cooling efficiency is increased and any plane temperature difference of the semiconductor wafer W is minimized, the semiconductor wafer W clamped to the electrostatic chuck 1 can be etched or otherwise processed uniformly by a plasma processing apparatus.

Although there has been described what is at present considered to be the preferred embodiment of the invention, it will be understood that the invention may be embodied in other specific forms without departing from the essential characteristics thereof. The present embodiment is therefore to be considered in all respects as illustrative, and not restrictive. The scope of the invention is indicated by the appended claims rather than by the foregoing description.

What is claimed is:

1. An electrostatic chuck for clamping a workpiece under electrostatic forces, comprising:
a dielectric layer;

an inner electrode disposed in said dielectric layer for producing electrostatic forces in response to application of a voltage thereto;

said dielectric layer having a volume resistivity of at most $10^9$ Ωm, said dielectric layer including a plurality of protrusions disposed on an upper surface thereof for clamping a workpiece thereto, said protrusions having clamping surfaces, respectively, for clamping the workpiece in contact therewith, said clamping surfaces having a total area proportioned to an entire area of said upper surface of the dielectric layer at a ratio of at least 1% and less than 10%.

2. An electrostatic chuck according to claim 1, wherein said clamping surfaces have a maximum height Rmax of at most 2.0 μm.

3. An electrostatic chuck according to claim 1, wherein said clamping surfaces have a center-line average roughness of at most 0.25 μm.

4. An electrostatic chuck according to claim 2, wherein each of said protrusions has a diameter of at most 3 mm, and adjacent ones of said protrusions are spaced at most 11 mm from each other.

5. An electrostatic chuck according to claim 4, wherein said dielectric layer has a coolant gas inlet hole defined therein and having an end opening at the upper surface thereof, for introducing a coolant gas into a space between said upper surface of the dielectric layer and the workpiece under a pressure ranging from 10 torr to 100 torr when the workpiece is clamped to the clamping surfaces.

6. An electrostatic chuck according to claim 3, wherein each of said protrusions has a diameter of at most 3 mm, and adjacent ones of said protrusions are spaced at most 11 mm from each other.

7. An electrostatic chuck according to claim 6, wherein said dielectric layer has a coolant gas inlet hole defined therein and having an end opening at the upper surface thereof, for introducing a coolant gas into a space between said upper surface of the dielectric layer and the workpiece under a pressure ranging from 10 torr to 100 torr when the workpiece is clamped to the clamping surfaces.

8. An electrostatic chuck comprising:

a metal plate;

a dielectric layer disposed on said metal plate and having a volume resistivity of at most $10^9$ Ωm; and an inner electrode disposed in said dielectric layer;

said dielectric layer including a plurality of protrusions disposed on an upper surface thereof for clamping a workpiece thereto, said protrusions having clamping surfaces, respectively, for clamping the workpiece in contact therewith, said clamping surfaces having a total area proportioned to an entire area of said upper surface of the dielectric layer at a ratio of at least 1% and less than 10%.

9. An electrostatic chuck according to claim 8, wherein said clamping surfaces have a maximum height Rmax of at most 2.0 μm.

10. An electrostatic chuck according to claim 8, wherein said clamping surfaces have a center-line average roughness of at most 0.25 μm.

11. An electrostatic chuck according to claim 9, wherein each of said protrusions has a diameter of at most 3 mm, and adjacent ones of said protrusions are spaced at most 11 mm from each other.

12. An electrostatic chuck according to claim 11, wherein said dielectric layer has an outer rim disposed on the upper surface thereof along an outer peripheral edge thereof and raised to substantially the same height as said protrusions, said protrusions being positioned radially inwardly of said outer rim.

13. An electrostatic chuck according to claim 12, wherein said protrusions are arranged in a multiplicity of concentric circular patterns disposed on the upper surface of the dielectric layer around a radial center of said upper surface, with said outer rim being positioned radially outwardly of the concentric circular patterns of the protrusions.

14. An electrostatic chuck according to claim 13, wherein said dielectric layer has a coolant gas inlet hole defined therein and having an end opening at the upper surface thereof, for introducing a coolant gas into a space between said upper surface of the dielectric layer and the workpiece under a pressure ranging from 10 torr to 100 torr when the workpiece is clamped to the clamping surfaces.

15. An electrostatic chuck according to claim 10, wherein each of said protrusions has a diameter of at most 3 mm, and adjacent ones of said protrusions are spaced at most 11 mm from each other.

16. An electrostatic chuck according to claim 15, wherein said dielectric layer has a coolant gas inlet hole defined therein and having an end opening at the upper surface thereof, for introducing a coolant gas into a space between said upper surface of the dielectric layer and the workpiece under a pressure ranging from 10 torr to 100 torr when the workpiece is clamped to the clamping surfaces.

17. An electrostatic chuck for clamping a workpiece under electrostatic forces, comprising:

a dielectric layer;

electrode means, including an inner electrode disposed in said dielectric layer, for producing electrostatic forces in response to application of a voltage thereto;

said dielectric layer including a plurality of protrusions disposed on an upper surface thereof for supporting a workpiece thereon, said protrusions having clamping surfaces, respectively, for clamping the workpiece in contact therewith, said clamping surfaces having a total area proportioned to a total area of the upper surface of the dielectric layer at a ratio of less than 10%; and means for introducing a low pressure coolant gas into a space between said upper surface of the dielectric layer and the workpiece as supported on said protrusions when the workpiece is clamped to the clamping surfaces.

18. An electrostatic chuck according to claim 17, wherein said dielectric layer has a volume resistivity of $\leq 10^9$ Ωm.

19. An electrostatic chuck according to claim 17, wherein said cooling means introduces the coolant gas at a pressure in a range of 10–100 torr, and said clamping surfaces have a maximum height $R_{max}$ of at most 2.0 μm.

\* \* \* \* \*

UNITED STATES PATENT AND TRADEMARK OFFICE
CERTIFICATE OF CORRECTION

PATENT NO. : 5,530,616
DATED : June 25, 1996
INVENTOR(S) : Tetsuo Kitabayashi, Atsushi Obara, Jun Miyaji, Yasumi Sago, Masami Sasaki It is certified that error appears in the above-indentified patent and that said Letters Patent is hereby corrected as shown below: Title page:

in the Abstract, line 4, change "di-electric" to --dielectric--;
      line 12, delete "5";
      line 13, change "and or" to --and/or--.

Column 1, line 9, delete "the".

Column 2, line 18, change "of" to --off--.

Column 3, line 21, change "given plasma processing conditions" to --a--.

Column 4, 64 line, change "varying plasma processing conditions" to --different plasma output power--.

Column 5, Table 2, change "clomped" to --clamped--.

Signed and Sealed this

Fifth Day of November, 1996

Attest:

BRUCE LEHMAN

*Attesting Officer*      *Commissioner of Patents and Trademarks*

UNITED STATES PATENT AND TRADEMARK OFFICE
CERTIFICATE OF CORRECTION

PATENT NO. : 5,530,616
DATED : June 25, 1996
INVENTOR(S) : Kitabayashi et al.

It is certified that error appears in the above-indentified patent and that said Letters Patent is hereby corrected as shown below:

On the title page, item [75], change "Miyagi" to --Miyaji--.

Signed and Sealed this

Twenty-fourth Day of December, 1996

Attest:

BRUCE LEHMAN

*Attesting Officer*      *Commissioner of Patents and Trademarks*